(12) United States Patent
Yoshida

(10) Patent No.: US 7,897,527 B2
(45) Date of Patent: Mar. 1, 2011

(54) CUSHIONING PAD FOR HOT PRESS

(75) Inventor: Akira Yoshida, Kanuma (JP)

(73) Assignee: Yamauchi Corporation, Osaka (JP)

( * ) Notice: Subject to any disclaimer, the term of this patent is extended or adjusted under 35 U.S.C. 154(b) by 0 days.

(21) Appl. No.: 11/180,300

(22) Filed: Jul. 13, 2005

(65) Prior Publication Data

US 2006/0014463 A1 Jan. 19, 2006

(30) Foreign Application Priority Data

Jul. 14, 2004 (JP) .................. 2004-207296

(51) Int. Cl.
*B32B 5/32* (2006.01)
(52) U.S. Cl. ....................................... 442/224
(58) Field of Classification Search .................. 442/224, 442/225, 226, 270, 271, 275, 241, 242, 260, 442/283, 277, 278; 428/909
See application file for complete search history.

(56) References Cited

U.S. PATENT DOCUMENTS

| 6,514,888 B1 | 2/2003 | Tanaka et al. | |
| 2005/0001351 A1* | 1/2005 | Yoshida | 264/236 |
| 2006/0068671 A1* | 3/2006 | Yoshida | 442/394 |
| 2007/0027259 A1* | 2/2007 | Yoshida | 525/199 |

FOREIGN PATENT DOCUMENTS

| DE | 255130 | 3/1988 |
| JP | S48-31033 | 9/1973 |
| JP | 55101224 | 8/1980 |
| JP | H05-22400 | 6/1993 |
| JP | 6305091 | 11/1994 |
| JP | 7125142 | 5/1995 |
| JP | 2000-052369 A | 2/2000 |
| JP | 2002011747 | 1/2002 |
| JP | 2003103552 | 4/2003 |
| JP | 2003211472 | 7/2003 |
| WO | WO 03/034798 A1 | 4/2003 |
| WO | WO PCT/JP2005/012816 | 6/2006 |
| WO | WO PCT/JP2005/012816 | 9/2006 |

OTHER PUBLICATIONS

Supplementary European Search Report of Application No. EP 05 76 5689, mailed Sep. 4, 2007.

* cited by examiner

*Primary Examiner* — Arti Singh-Pandey
(74) *Attorney, Agent, or Firm* — Ditthavong Mori & Steiner, P.C.

(57) ABSTRACT

A cushioning pad for hot press is a laminated plate body comprising a rubber layer, a high elastic modulus reinforced layer, and a low elastic modulus reinforced layer. The rubber layer is sandwiched between the high elastic modulus reinforced layer and the low elastic modulus reinforced layer positioned on its opposite side, and the laminated body has entirely no airspace.

4 Claims, 4 Drawing Sheets

CUSHIONING PAD FOR HOT PRESS

BACKGROUND OF THE INVENTION

1. Field of the Invention

The present invention relates to a cushioning pad for hot press. More particularly, the present invention relates to a cushioning pad for hot press which is used when an object product is subjected to pressing or thermocompression bonding in the process of producing a precision instrument component such as a printed circuit board including a copper-clad laminate, a flexible printed circuit board, and multilayer lamination board, an IC card, a liquid crystal display panel, or a ceramic lamination board (referred to as the laminated plate in the present invention hereinafter). Especially, the present invention relates to a cushioning pad for hot press which can be suitably used for hot press the laminated plate such as the multilayer plate for which a very high thickness precision is required.

2. Description of the Background Art

In the process of pressing or thermocompression bonding in manufacturing the laminated plate, there is used a method of sandwiching a laminated plate material 21 which is an object to be pressed between hot plates 22 and 22 and applying a predetermined pressure and heat thereto as shown in FIG. 4. In order to obtain a product of high precision, it is necessary to apply the heat and the pressure uniformly over a whole surface of the laminated plate material 21 during the hot press. For the purpose of the above, the hot press is performed with a planar cushioning pad 23 interposed between the hot plate 22 and the laminated plate material 21.

Conventionally, as the cushioning pad for hot press 23, various kinds of materials are used, such as kraft paper, organic or inorganic fibers bonded with a binder, rubber, nonwoven fabric, and a laminated body of the rubber and the nonwoven fabric. Materials other than the kraft paper can be repeatedly used in the pressing basically.

Japanese Unexamined Patent Publication No. 55-101224 discloses a cushioning pad for hot press formed of the nonwoven fabric. According to Japanese Unexamined Patent Publication No. 55-101224, a multilayer needle felt cushioning pad is disclosed in which a batt fiber and a foundation cloth are laminated into a plurality of layers and integrally bonded by a needle punch and finished by a heat treatment.

Japanese Utility Model Publication No. 48-31033 discloses a cushioning pad for hot press formed of a laminated body including the nonwoven fabric and the rubber. According to Japanese Utility Model Publication No. 48-31033, cushioning pad for pressing is disclosed in which between two needlepunched bonded fiber layers, an elastic sheet having a thickness smaller than that of the bonded fiber layer is integrally provided without using an adhesive agent.

The cushioning pad for hot press disclosed in either Japanese Unexamined Patent Publication No. 55-101224 or Japanese Utility Model Publication No. 48-31033 comprises the nonwoven fabric. Since the cushioning pad for hot press comprising the nonwoven fabric has a preferable cushion property because it contains airspace inside, it is used in forming a general copper-clad laminate or printed circuit board in many cases.

However, recently, since the laminated plate such as the printed circuit board has been miniaturized and requires high precision, it is necessary to manufacture a multilayer plate in which precisely printed circuits are laminated into a plurality of layers, with high thickness precision. When the laminated plate which requires high thickness precision is hot pressed, the cushioning pad comprising the nonwoven fabric is not suitable because it contains the airspace and its cushion property is too much in the thickness direction.

Japanese Utility Model Publication No. 5-22400 discloses a cushioning pad for hot press. According to Japanese Utility Model Publication No. 5-22400, a cushioning pad for hot press is disclosed in which a silicone rubber layer is formed on each surface of a glass fiber foundation cloth and a glass fiber cloth impregnated with a conductive fluoro resin is integrally provided on each surface thereof.

The cushioning pad for hot press disclosed in the Japanese Utility Model Publication No. 5-22400 comprises two rubber layers and each rubber layer is sandwiched between glass clothes positioned upper and lower surfaces thereof. Since the cushioning pad does not contain airspace inside thereof, thickness precision of an object to be pressed can be easily achieved. However, according to the cushioning pad for hot press disclosed in Japanese Utility Model Publication No. 5-22400, an end of the rubber layer is cut into strips after it is used repeatedly in the hot press.

Problems of the cushioning pad for hot press disclosed in Japanese Utility Model Publication No. 5-22400 are schematically described with reference to the drawings. FIG. 5A shows a cushioning pad for hot press 24 comprising two rubber layers 25 and each rubber layer 25 is sandwiched between inorganic fiber woven fabric layers 26 such as glass cloth positioned on its upper and lower surfaces. FIG. 5B shows a state of the end of the cushioning pad 24 during the hot press. When the cushioning pad 24 is used in the hot press, the rubber layer 25 protrudes in a planar direction when it is pressurized. Meanwhile, since the inorganic fiber woven fabric 26 positioned on the upper and lower surfaces of the rubber layer 25 has a high modulus of elasticity in tension, its dimension is hardly changed in the planar direction, so that the upper and lower surfaces of the rubber layer 25 are fixed by the inorganic fiber woven fabric 26 and cannot extend in the planar direction. Therefore, a middle part of the end of the rubber layer 25 in the thickness direction becomes a protrusion 27. When the pressure is released, the protrusion 27 is returned to its original position by dimension stability of the inorganic fiber woven fabric 26 and elastic restoring force of the rubber layer 25, so that the cushioning pad 24 is returned to the state shown in FIG. 5A. During repeated use of the cushioning pad in the hot press, since the upper and lower surfaces of the rubber layer 25 are fixed by the inorganic fiber woven fabric 26 and cannot extend, only the middle part of the rubber layer 25 in the thickness direction repeats protrusion and restoration. As a result it is thought that a cut strip 25a is generated at the end of the rubber layer 25 in an early stage because of a stress caused by the repeated protrusion and restoration as shown in FIG. 5C.

In order to solve the problem in the cushioning pad for hot press having the structure shown in FIGS. 5A to 5C, the inventors of the present invention made an attempt to replace the inorganic fiber woven fabric with an organic fiber woven fabric having a relatively low modulus of elasticity in tension, that is, a cushioning pad 28 in which upper and lower surfaces of a rubber layer 29 are sandwiched between an organic fiber woven fabric 30 such as a meta aromatic polyamide fiber having a relatively low modulus of elasticity in tension as schematically shown in FIG. 6A. In this case, the organic fiber woven fabric 30 can extend in the planar direction to some extent. Since the organic fiber woven fabric 30 can also extend along with the protrusion of the rubber layer 29 at the time of the press, the stress imposed on the rubber layer 29 is reduced. However, in this case, since the organic fiber woven fabric 30 extends itself when it is pressurized, it is necessary that the whole configuration of the cushioning pad 28 should be restored by the elastic restoring force of the rubber layer 29 only at the time of releasing the pressure. Thus, the cushioning pad 28 shown in FIG. 6 is inferior in configuration restoring property as compared with the cushioning pad 24 shown in FIGS. 5A to 5C. As a result, while the cushioning pad 28 shown in FIG. 6 is repeatedly used in the hot press, the cushioning pad 28 is elongated in an early stage as a whole in the planar direction because of fatigue of the rubber layer 29, so that the thickness precision deteriorates. Further, as the cushioning pad 28 is repeatedly used in the hot press, a damaged part 31 is also generated at the end of the rubber layer 29 as shown in FIG. 6B.

SUMMARY OF THE INVENTION

It is an object of the present invention to provide a cushioning pad for hot press having excellent dimension stability and durability by which a laminated plate can be hot pressed with high thickness precision. A cushioning pad for hot press according to the present invention is a laminated body comprising a rubber layer, a high elastic modulus reinforced layer, and a low elastic modulus reinforced layer. The rubber layer is sandwiched between the high elastic modulus reinforced layer positioned on its one surface and the low elastic modulus reinforced layer positioned on its other surface. The laminated body has entirely no airspace, which means that it does not have airspace inside as will be described below.

According to the laminated body constituting the cushioning pad for hot press, since the one surface and the other surface of the rubber layer are sandwiched between the high elastic modulus reinforced layer and the low elastic modulus reinforced layer, the rubber layer which is compressed in the thickness direction tries to escape in the planar direction when it is pressed. The rubber layer hardly extends in the planar direction, however, because it is integrated with the high elastic modulus reinforced layer on one surface of the rubber layer. Meanwhile, the other surface of the rubber layer can extend in the planar direction to some extent along with the low elastic modulus reinforced layer. Therefore, even after it is repeatedly used in the hot press, the stress imposed on the rubber layer is reduced because of the low elastic modulus reinforced layer, so that a cut strip is prevented from being generated at an end of the rubber layer. When the pressure is released, the rubber layer and the low elastic modulus reinforced layer are pulled by the high elastic modulus reinforced layer which does not extend, so that they can be returned to original dimensions combined with elastic restoring force of the rubber. Therefore, even after it is repeatedly used in the hot press, the rubber layer is prevented from being stretched out and the dimension of the cushioning pad in the planar direction can be stable for a long period of time and the rubber layer is prevented from being damaged. Further, since the laminated body has entirely no airspace, the cushioning pad having high thickness precision can be provided.

As a result, the laminated plate can be hot pressed with high thickness precision, and there can be provided a cushioning pad for hot press which is superior in dimension stability and durability.

It is preferable that the rubber layer is 0.1 mm to 1.0 mm in thickness. In this dimension, a deformation amount of the rubber layer in the planar direction is not increased so much when it is pressed, the cut strip is not generated at the end of the rubber layer, a cushion property of the rubber layer can be provided, and durability and a cushion property of the cushioning pad for hot press can be provided at the same time.

Further, it is preferable that at least one outermost layer of the laminated body is the high elastic modulus reinforced layer.

According to the cushioning pad for hot press of the present invention, it is preferable that the laminated body comprises two rubber layers, the outermost layers of both front and back surfaces of the laminated body are the high elastic modulus reinforced layers and the low elastic modulus reinforced layer is interposed between the two rubber layers.

In this case, since the laminated body is symmetric in the vertical direction, even if the cushioning pad is repeatedly used in the hot press, it is prevented from being warped. When the laminated body is structured with the high elastic modulus reinforced layer, the rubber layer having a thickness of 0.1 mm to 1.0 mm, the low elastic modulus reinforced layer, the rubber layer having a thickness of 0.1 mm to 1.0 mm and the high elastic modulus reinforced layer in this order, the cushioning pad can be obtained with superior in dimension stability and durability and a predetermined cushion property can be provided, and the cushioning pad is suitable for use in manufacturing the laminated plate with high thickness precision by the hot press.

More preferably, according to the present invention, the high elastic modulus reinforced layer has a high modulus of elasticity in tension and the low elastic modulus reinforced layer has a relatively low modulus of elasticity in tension. More specifically, it is preferable that the modulus of elasticity in tension of the high elastic modulus reinforced layer is 100 MPa or more. Meanwhile, it is preferable that the modulus of elasticity in tension of the low elastic modulus reinforced layer is 50 MPa or less. It is also preferable that each of the high elastic modulus reinforced layer and the low elastic modulus reinforced layer is a woven fabric.

The cushioning pad for hot press may have a structure in which a surface layer comprising a woven fabric is further bonded to a surface of the laminated body. When the surface layer comprises double structure of the woven fabric, the dimension stability of the whole cushioning pad is further improved and even after it is repeatedly used in the hot press, preferable thickness precision can be maintained for a long period of time.

DESCRIPTION OF THE PREFERRED EMBODIMENTS

Figure 1:
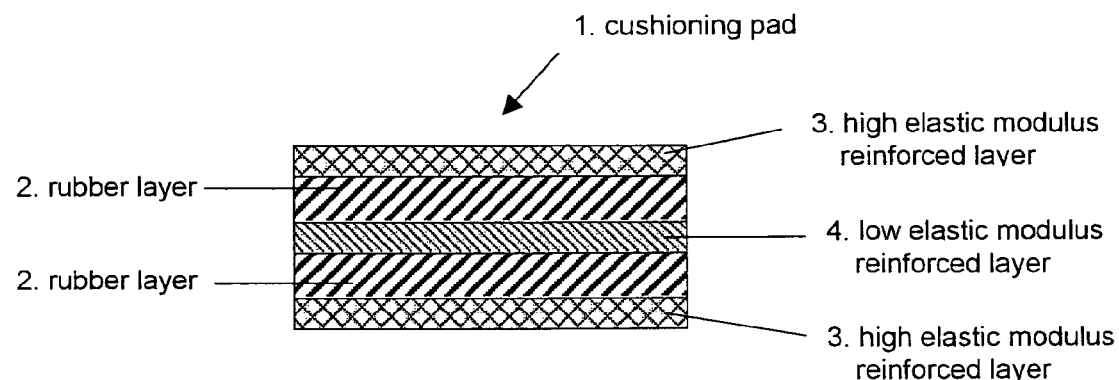
FIG. 1 is a sectional view showing an example of a cushioning pad for hot press according to the present invention.

FIG. 1 shows an example of a cushioning pad for hot press according to the present invention. The cushioning pad for hot press is a laminated body comprising five layers such as two rubber layers 2 and 2, high elastic modulus reinforced layers 3 and 3 constituting the outermost layers of both front and back surfaces of the body, and a low elastic modulus reinforced layer 4 positioned between the two rubber layers 2 and 2. Each rubber layer 2 is sandwiched between the high elastic modulus reinforced layer 3 and the low elastic modulus reinforced layer 4. The cushioning pad 1 does not comprise a material having airspace such as nonwoven fabric or a sponge rubber and it is a plate-shaped laminated body which does not contain airspace as a whole.

The rubber layer 2 is 0.1 mm to 1.0 mm in thickness. The kind of the rubber may be a heat-resisting rubber such as fluoro rubber, an EPM, an EPDM, a hydrogenated nitrile rubber, a silicone rubber, an acrylic rubber, a butyl rubber and the like.

The high elastic modulus reinforced layer 3 is preferably a woven fabric whose modulus of elasticity in tension is 100 MPa or more. As a preferable material used for the high elastic modulus reinforced layer 3, there are an inorganic fiber such as a glass fiber, a metal fiber, a silica fiber, a carbon fiber and the like, and a super-high-strength heat-resisting organic fiber such as a para aromatic polyamide fiber, a polybenzazole fiber and the like. Especially, the glass fiber, the para aromatic polyamide fiber and the polybenzazole fiber are preferably used.

The low elastic modulus reinforced layer 4 is preferably a woven fabric whose modulus of elasticity in tension is 50 MPa or less. As a preferable material used for the low elastic modulus reinforced layer 4, there is a heat-resisting organic fiber such as a meta aromatic polyamide fiber, a nylon fiber, a polyester fiber, a polyphenylene sulfide fiber, an acrylic fiber, a polyimide fiber, a polyamideimide fiber and the like.

The woven fabric used in the high elastic modulus reinforced layer 3 and the low elastic modulus reinforced layer 4 may be woven appropriately by selecting from well-known weaves such as a plain weave, a multiple weave, a satin weave, a twill weave, a hexagonal pattern weave, a gray sheeting and the like.

Although the cushioning pad for hot press comprises the five-layer laminated body comprising two rubber layers 2 and 2 in the example shown in FIG. 1, the cushioning pad for hot press according to the present invention may be a three-layer body in which the high elastic modulus reinforced layer 3 is laminated on one surface of the rubber layer 2 and the low elastic modulus reinforced layer 4 is laminated on the other surface of the rubber layer 2. The cushioning pad for hot press may comprise three or more rubber layers 2. When three or more rubber layers 2 are provided, each rubber layer 2 is laminated so as to be sandwiched between the high elastic modulus reinforced layer 3 and the low elastic modulus reinforced layer 4. That is, the high elastic modulus reinforced layer 3 and the low elastic modulus reinforced layer 4 are alternately arranged and the rubber layer 2 is interposed between the high elastic modulus reinforced layer 3 and the low elastic modulus reinforced layer 4. In either case, the cushioning pad for hot press is so constituted that at least one outermost layer is the high elastic modulus reinforced layer 3.

Figure 2:
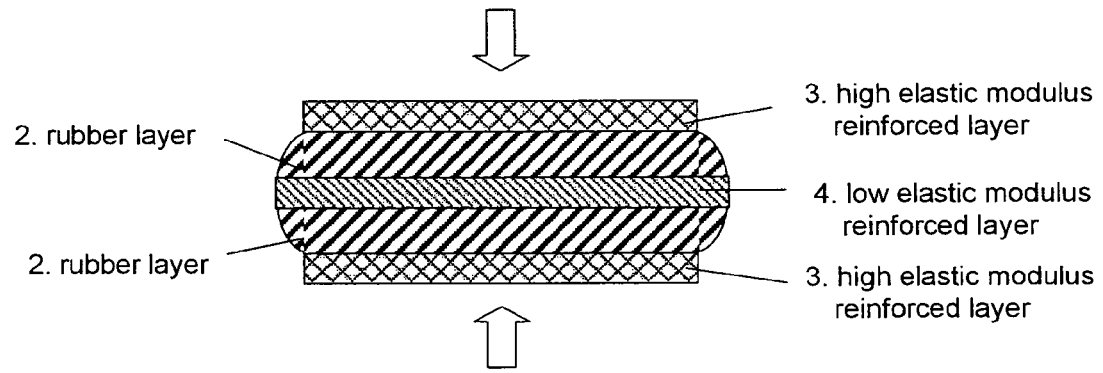
FIG. 2 is a sectional view showing a state when the cushioning pad for hot press shown in FIG. 1 is pressed.
Figure 4:
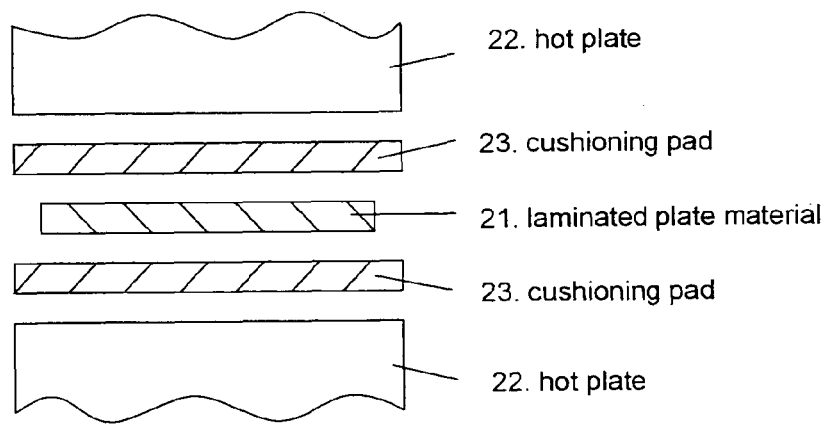
FIG. 4 is a schematic view showing a hot press machine.
Figure 5A:
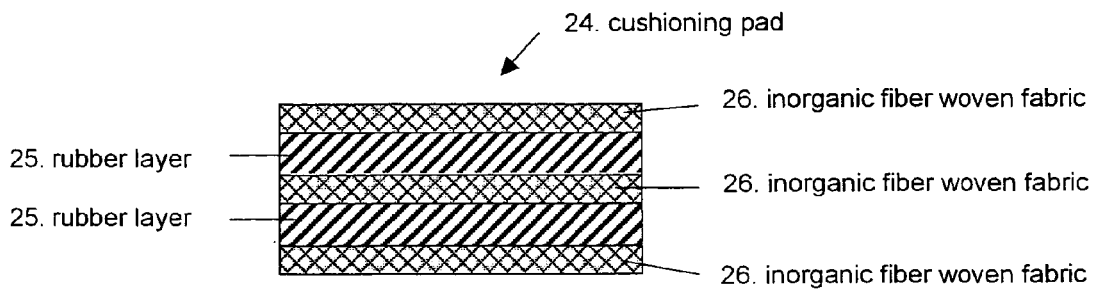
FIGS. 5A to 5C are sectional views showing a conventional cushioning pad for hot press.
Figure 5B:
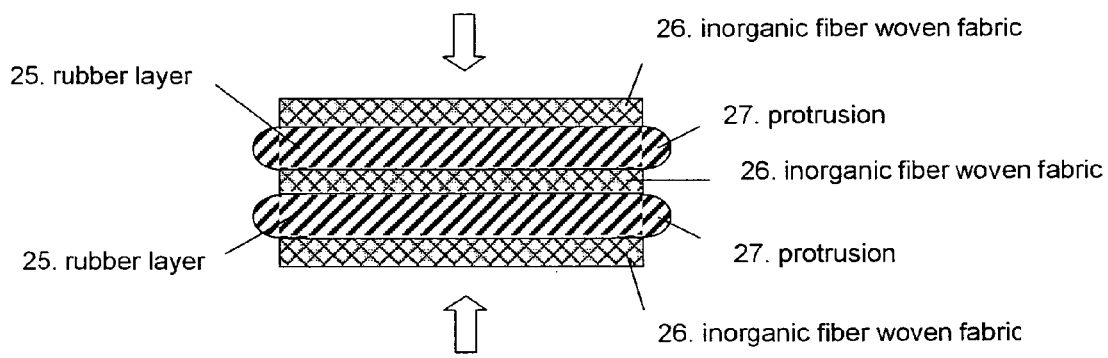
Figure 5C:
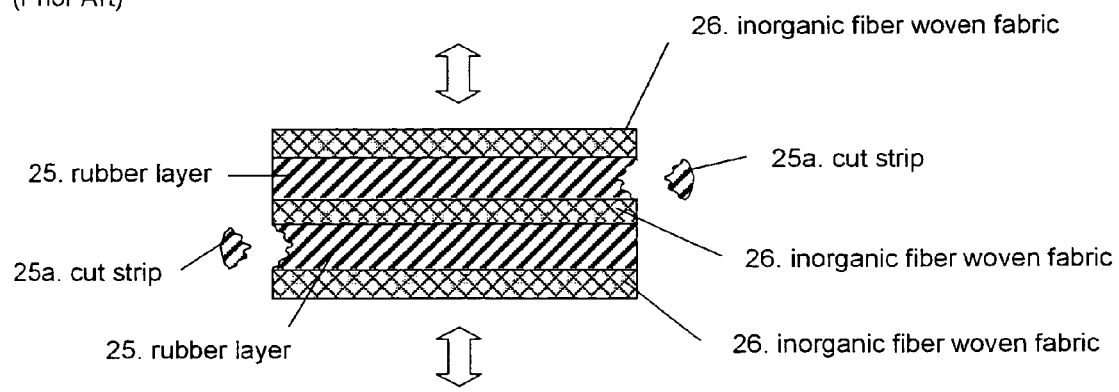
Figure 6A:
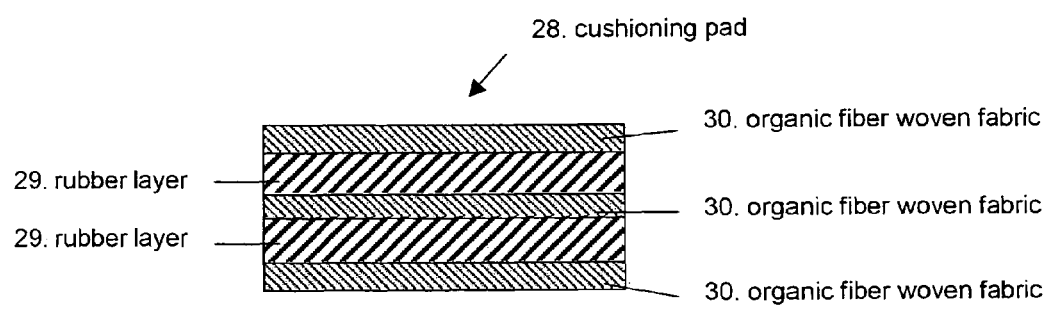
FIGS. 6A and 6B are sectional views showing another example of the conventional cushioning pad for hot press.
Figure 6B:
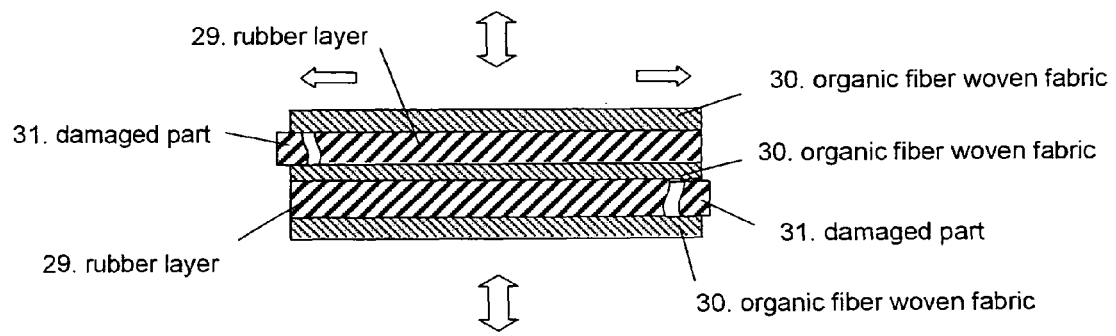

FIG. 2 shows a state in which the cushioning pad for hot press shown in FIG. 1 is used as a cushioning pad 23 in a press machine shown in FIG. 4 and pressurized. As shown in FIG. 2, although the rubber layer 2 compressed in a thickness direction tries to escape in a s planar direction, since one surface of the rubber layer 2 is integrated with the high elastic modulus reinforced layer 3, there is almost no extension generated in the planar direction. Meanwhile, since the other surface of the rubber layer 2 is integrated with the low elastic modulus reinforced layer 4, it can extend in the planar direction to some extent, so that stress applied to the rubber layer 2 can be reduced. When the pressure is released, the rubber layer 2 and the low elastic modulus reinforced layer 4 are pulled by the high elastic modulus reinforced layer 3 in which there is no extension generated and they can be returned to the original dimension shown in FIG. 1 combined with elastic restoring force of the rubber. Therefore, even after the cushioning pad 1 is repeatedly used, a cut strip caused by stress or a damage caused by extension is not generated in the rubber layer 2 and durability of the cushioning pad 1 is increased. Further, since the rubber layer 2 is prevented from being stretched out, the dimension of the cushioning pad 1 can be stable for a long period of time.

The outermost layer facing a laminated plate material 21 to be pressed is the high elastic modulus reinforced layer and does not contain airspace inside in the cushioning pad 1, and therefore, the cushioning pad 1 is superior in dimension stability and thickness precision as a whole. As a result, the laminated plate material 21 which is the object to be pressed can be formed with high thickness precision.

Figure 3:
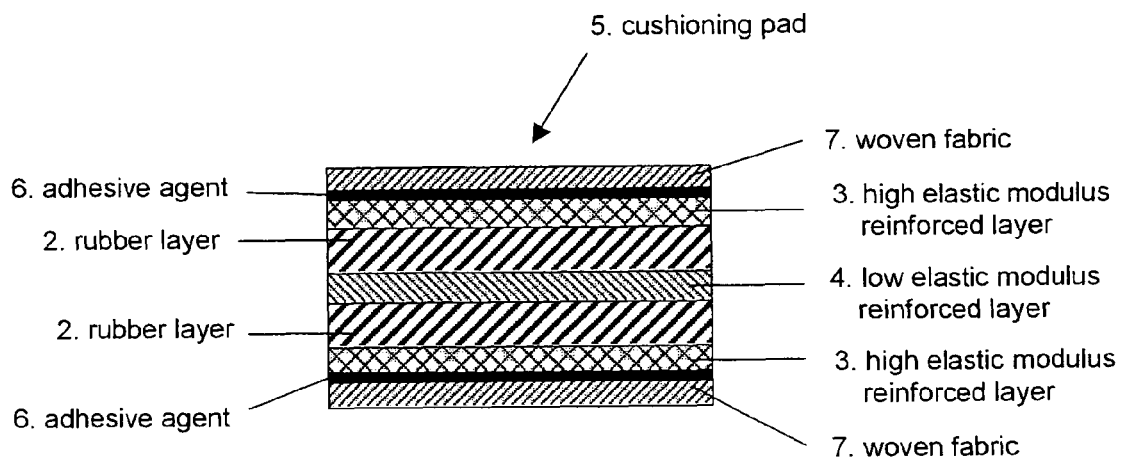
FIG. 3 is a sectional view showing another example of the cushioning pad for hot press according to the present invention.

FIG. 3 shows another example of the cushioning pad for hot press according to the present invention. According to a cushioning pad 5 shown in FIG. 3, woven fabrics 7 and 7 are further laminated on the upper and lower surfaces of the cushioning pad 1 shown in FIG. 1 by adhesive agents 6 and 6. As the adhesive agent, a heat-resisting rubber is preferably used such as a fluoro rubber, an EPM, an EPDM, a hydrogenated nitrile rubber, a silicone rubber, an acrylic rubber, a butyl rubber or the like. A thickness of the adhesive agent layer 6 is preferably 10 μm to 100 μm. Although the material of the woven fabric used for the surface is not particularly limited, it is preferable to select from the materials for the above described high elastic modulus reinforced layer 3 and the low elastic modulus reinforced layer 4. According to the cushioning pad for hot press 5 shown in FIG. 3, a double structure of woven fabric including the high elastic modulus reinforced layer 3 and the woven fabric 7 is provided on the surface. Therefore, the dimension stability of the entire cushioning pad for hot press 5 is further improved and even after it is repeatedly used, preferable thickness precision can be maintained for a long period of time.

The cushioning pad for hot press according to the present invention can be used under the hot press condition of the temperature of 120° C. to 250° C. and the pressure of 0.5 MPa to 6 MPa in general. The cushioning pad for hot press according to the present invention can exert its better performance under the hot press condition of the temperature of 170° C. to 250° C. and the pressure of 0.5 MPa to 6 Mpa.

Although the embodiments of the present invention have been described with reference to the drawings, the present invention is not limited to the illustrated embodiments. Various modifications and variations can be made within the same or equivalent scope of the present invention.

The cushioning pad for hot press according to the present invention can be suitably used when a laminated plate is hot pressed such as a printed circuit board, especially a laminated plate such as multilayer lamination board which requires high thickness precision. The cushioning pad for hot press according to the present invention is especially advantageously used under the heat press condition such that the temperature is 120° C. to 250° C. and the pressure is 0.5 MPa to 6 MPa.

What is claimed is:

1. A cushioning pad for hot press of a plate-shaped laminated body comprising a laminated structure including a rubber layer, a high elastic modulus reinforced woven fabric layer, and a low elastic modulus reinforced woven fabric layer, wherein said rubber layer is sandwiched between said high elastic modulus reinforced woven fabric layer positioned on its one surface and said low elastic modulus reinforced woven fabric layer positioned on its other surface, and at least one outermost layer of said laminated structure is said high elastic modulus reinforced woven fabric layer, said laminated body has entirely no airspace, and said laminated structure comprises two rubber layers, the outermost layers of both front and back surfaces of the laminated structure are the high elastic modulus reinforced woven fabric layers and said low elastic modulus reinforced woven fabric layer is interposed between said two rubber layers.

2. The cushioning pad for hot press according to claim 1, wherein said rubber layer is 0.1 mm to 1.0 mm in thickness.

3. The cushioning pad for hot press according to claim 1, wherein said high elastic modulus reinforced layer is a woven fabric whose modulus of elasticity in tension is 100 MPa or more, and said low elastic modulus reinforced layer is a woven fabric whose modulus of elasticity in tension is 50 MPa or less.

4. The cushioning pad for hot press according to claim 1, wherein a surface layer comprising a woven fabric is further bonded onto a surface of said laminated body.

* * * * *